United States Patent [19]
Taylor et al.

[11] Patent Number: 5,567,289
[45] Date of Patent: Oct. 22, 1996

[54] ROTATING FLOATING MAGNETRON DARK-SPACE SHIELD AND CONE END

[75] Inventors: Clifford L. Taylor, Nerstrand; Daniel T. Crowley, Owatonna, both of Minn.

[73] Assignee: Viratec Thin Films, Inc., Faribault, Minn.

[21] Appl. No.: 285,869

[22] Filed: Aug. 4, 1994

Related U.S. Application Data

[63] Continuation-in-part of Ser. No. 174,533, Dec. 30, 1993.

[51] Int. Cl.$^6$ .................................................. C23C 14/35
[52] U.S. Cl. ................................. 204/298.11; 204/298.22
[58] Field of Search ........................... 204/298.11, 298.22

[56] References Cited

U.S. PATENT DOCUMENTS

| | | | |
|---|---|---|---|
| 4,356,073 | 10/1982 | McKelvey | 204/192.12 |
| 4,362,611 | 12/1982 | Logan et al. | 204/298.06 |
| 4,407,713 | 10/1983 | Zega | 204/298.22 |
| 4,422,916 | 12/1983 | McKelvey | 204/192.12 |
| 4,443,318 | 4/1984 | McKelvey | 204/298.23 |
| 4,445,997 | 5/1984 | McKelvey | 204/298.23 |
| 4,466,877 | 8/1984 | McKelvey | 204/298.23 |
| 5,100,527 | 3/1992 | Stevenson et al. | 204/298.22 |
| 5,108,574 | 4/1992 | Kirs et al. | 204/298.22 |
| 5,200,049 | 4/1993 | Stevenson et al. | 204/298.22 |
| 5,213,672 | 5/1993 | Hartig et al. | 204/298.22 |
| 5,464,518 | 11/1995 | Sieck et al. | 204/192.12 |
| 5,470,452 | 11/1995 | Dickey et al. | 204/298.21 |

OTHER PUBLICATIONS

M. Wright et al., "Design advances and applications of the rotatable cylindrical magnetron," *Journal of Vacuum Science and Technology A*, vol. 4, No. 3, May/Jun. 1986, pp. 388–392.

*Primary Examiner*—Aaron Weisstuch
*Attorney, Agent, or Firm*—William J. Egan, III; Fish & Richardson, P.C.

[57] ABSTRACT

A rotatable magnetron cathode having at least one supported end adapted for attachment to a spindle. At least one dark space shield is attached to the cathode at a supported end to rotate therewith, and is electrically floating relative to the cathode. If the cathode is cantilever mounted, a floating cone end shield, facing away from the gas discharge and not overlapping the cylindrical cathode wall, is used at the free end.

8 Claims, 8 Drawing Sheets

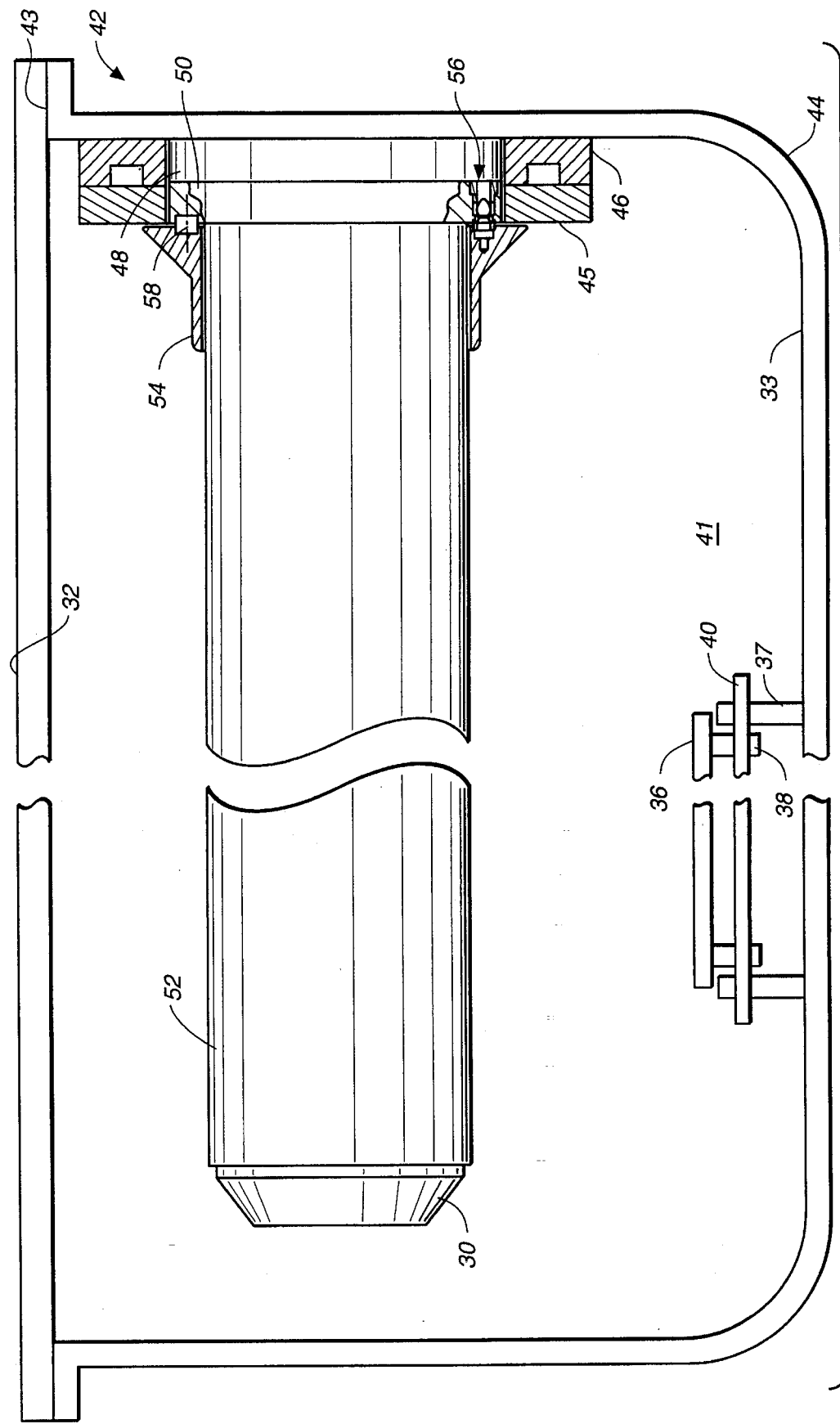
FIG._1

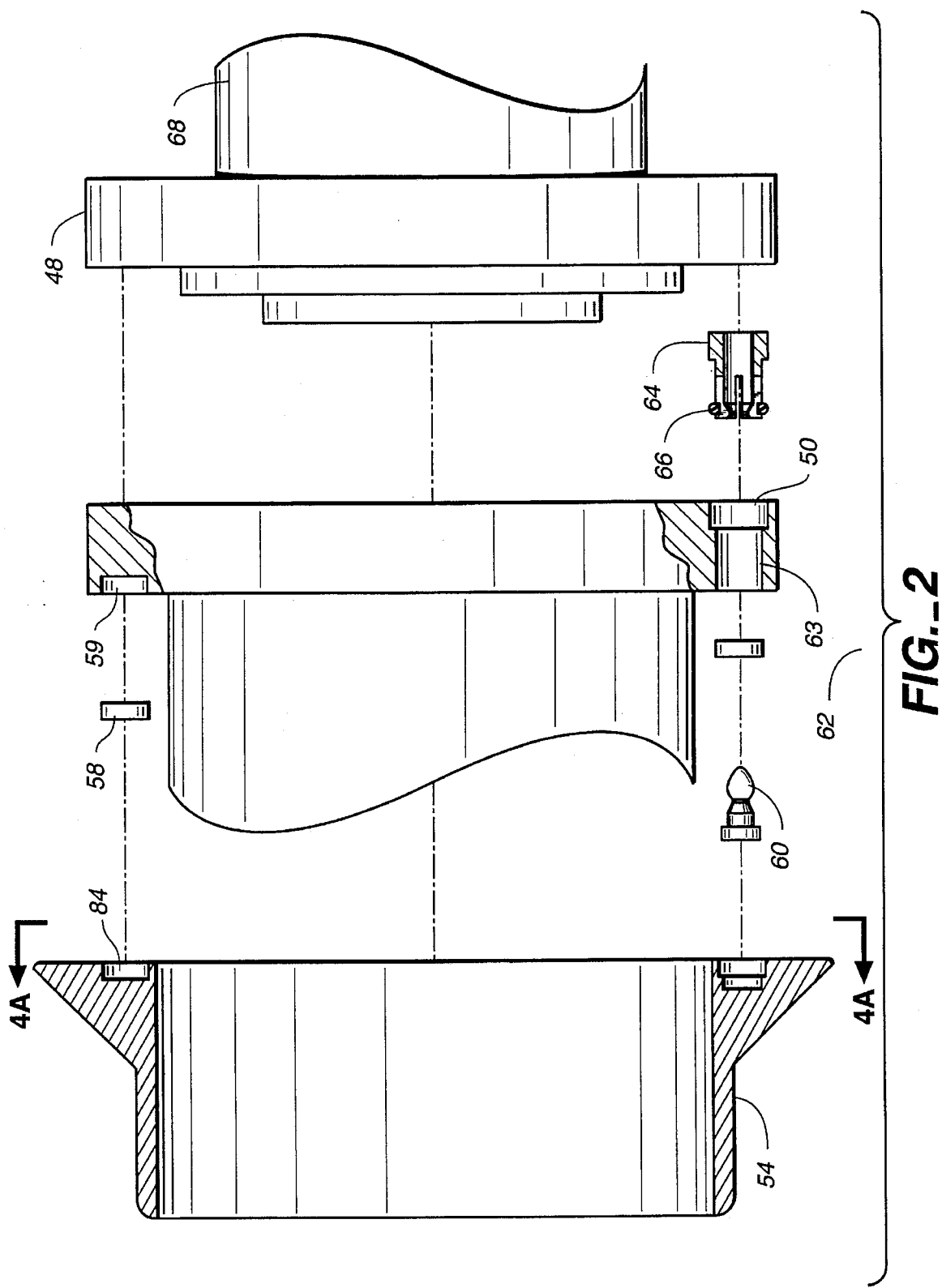
FIG._2

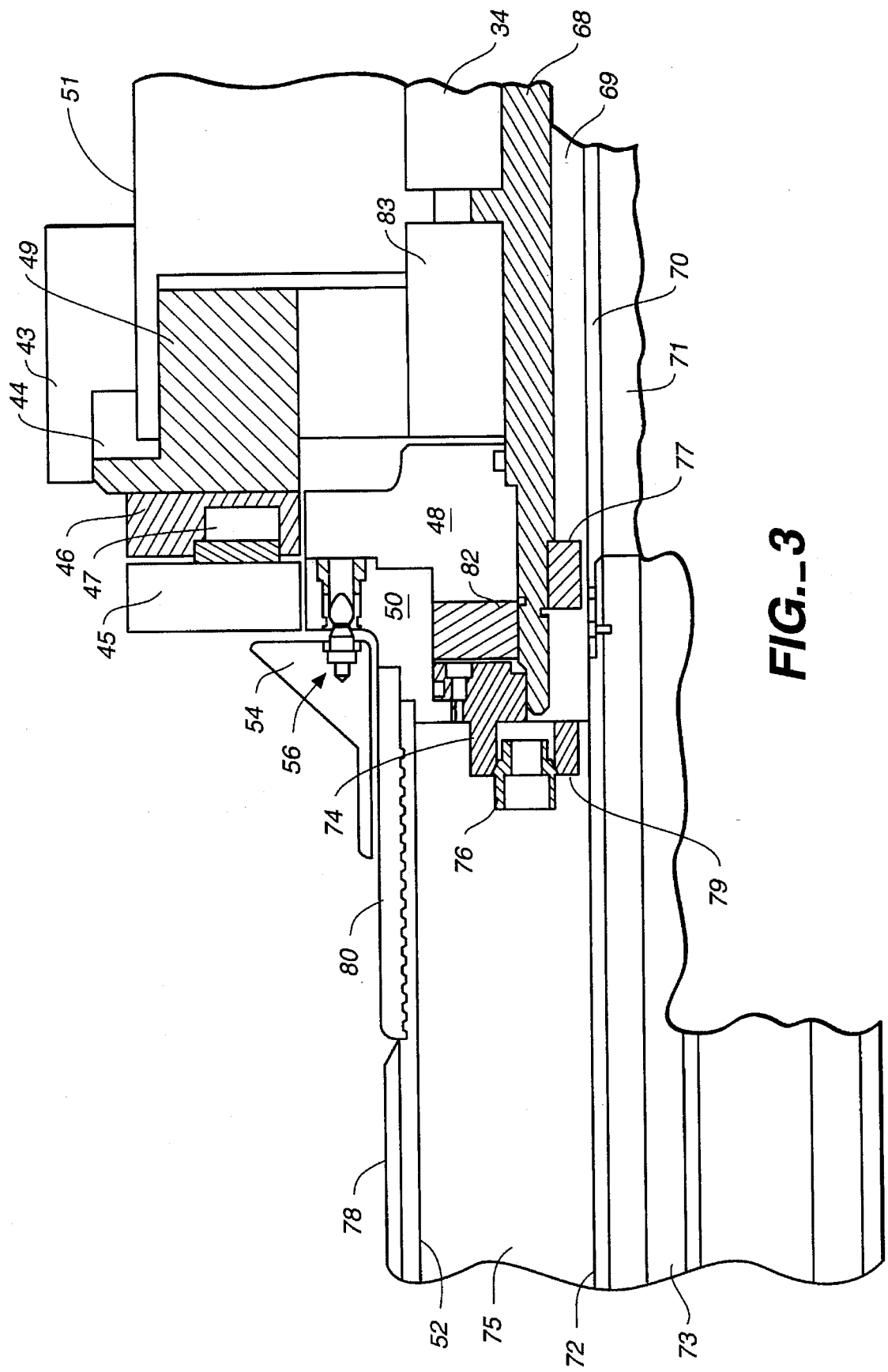
FIG._3

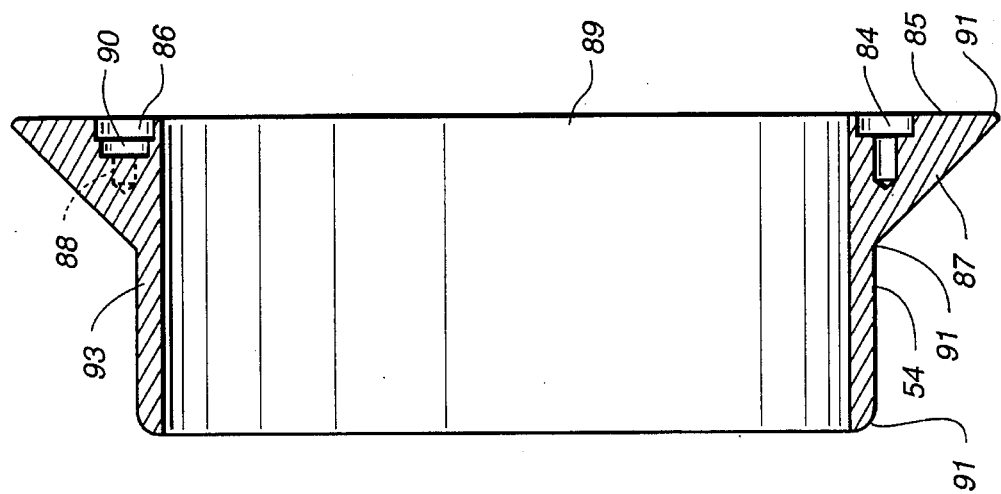
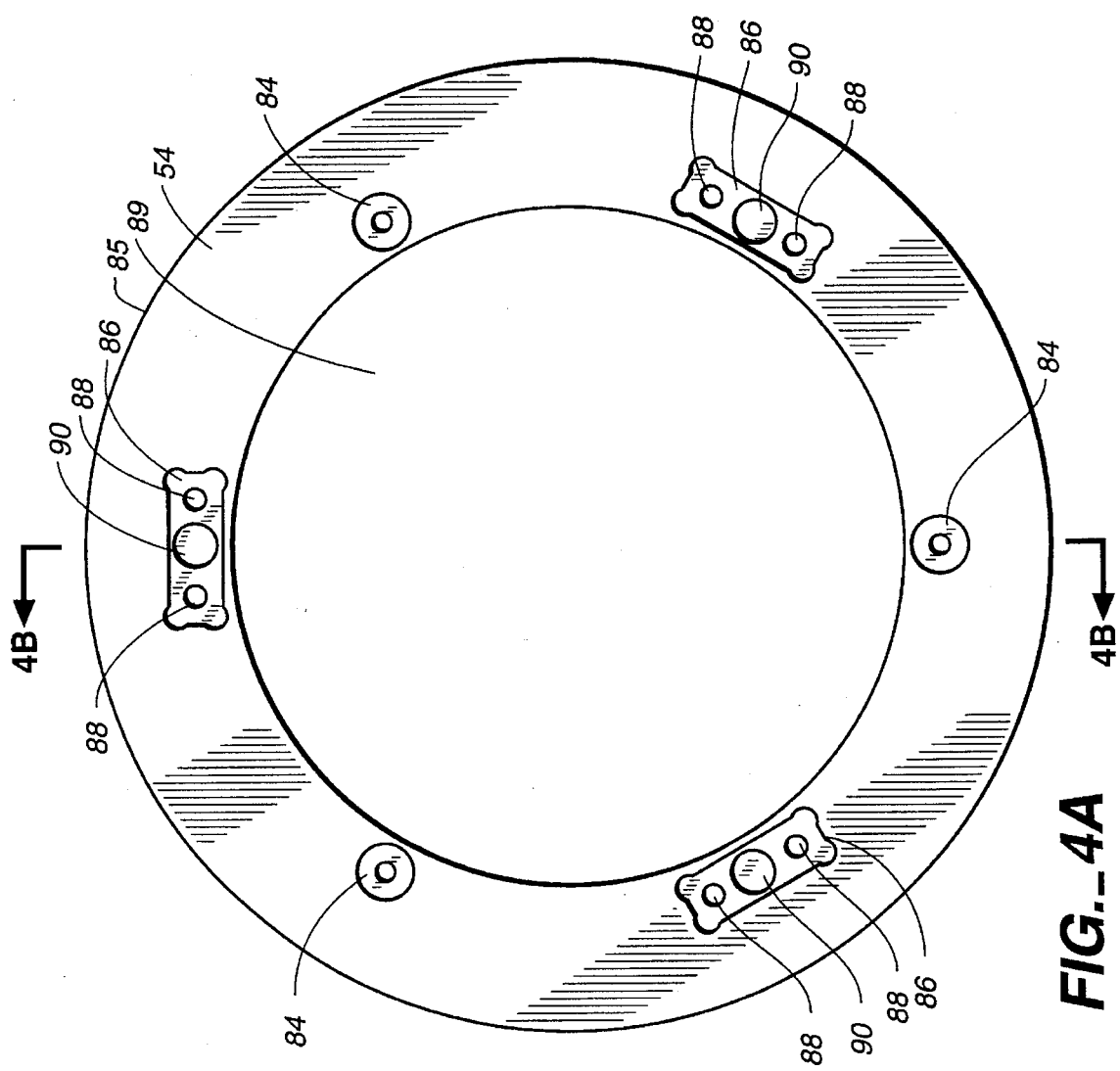

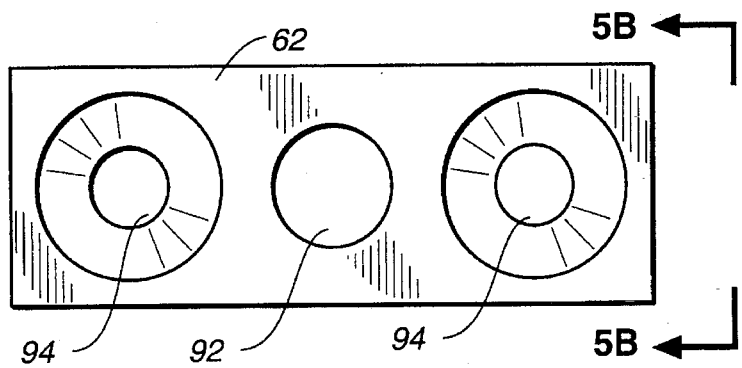
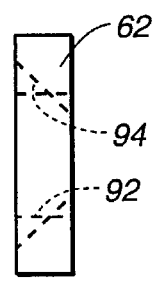
FIG._5A  FIG._5B
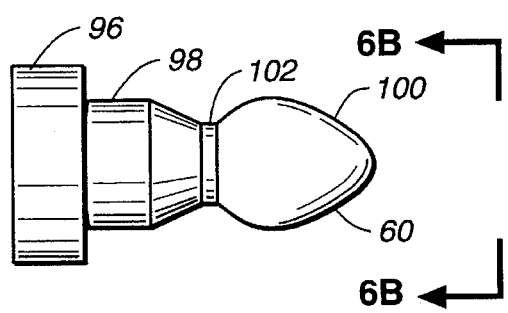
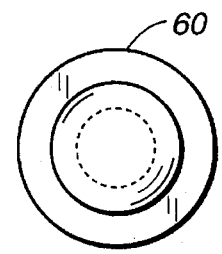
FIG._6A  FIG._6B
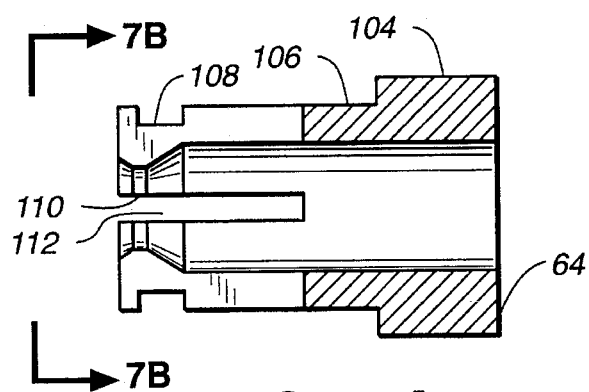
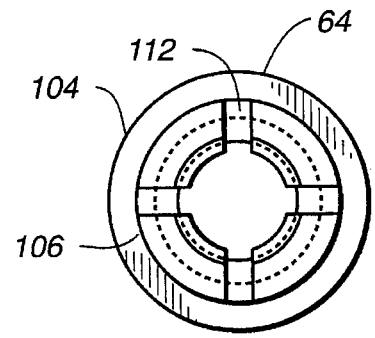
FIG._7A  FIG._7B

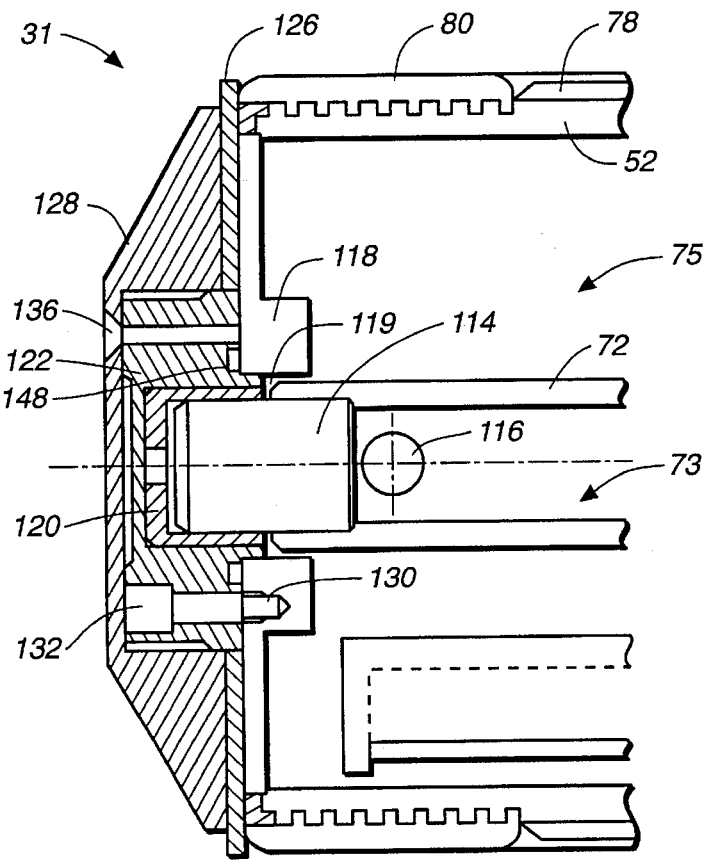
FIG._8A
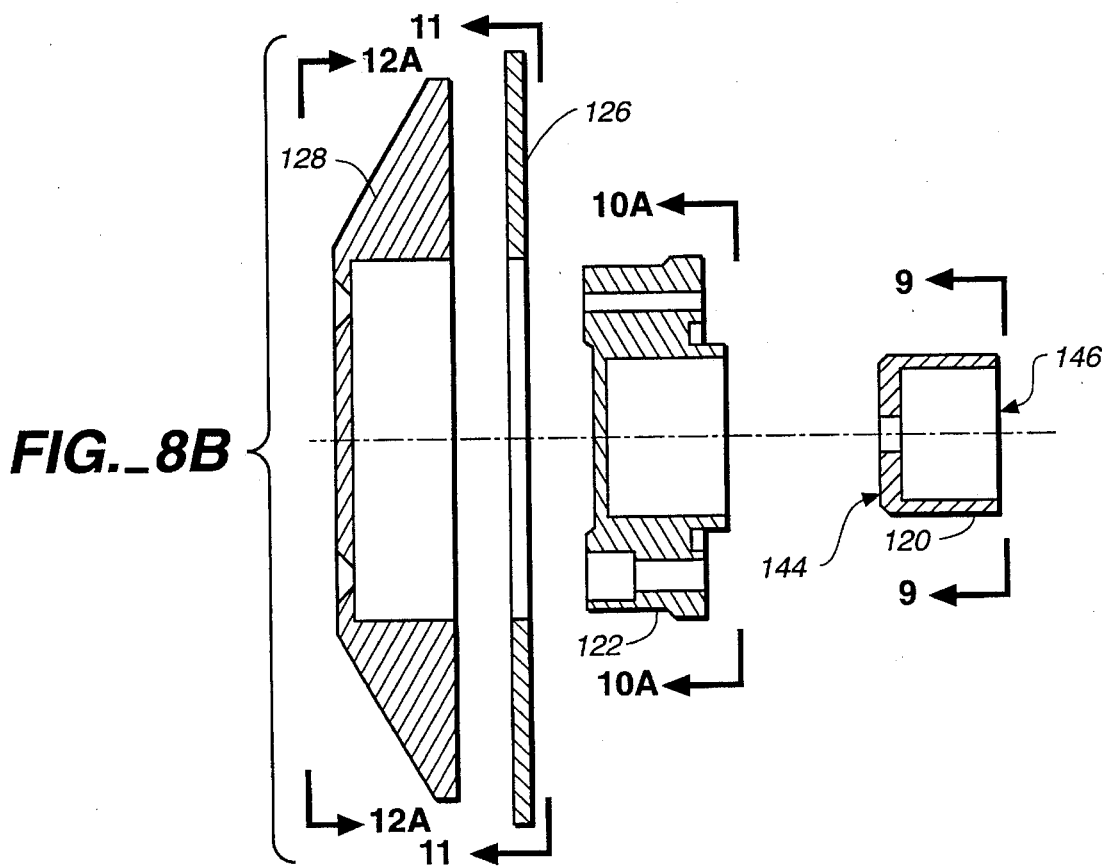
FIG._8B

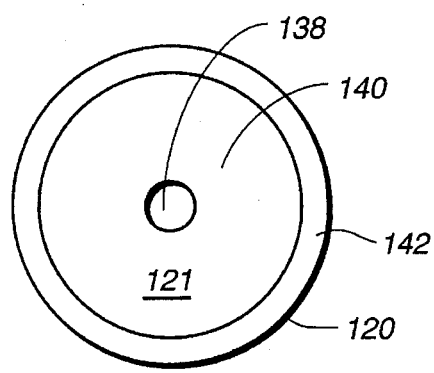
FIG._9
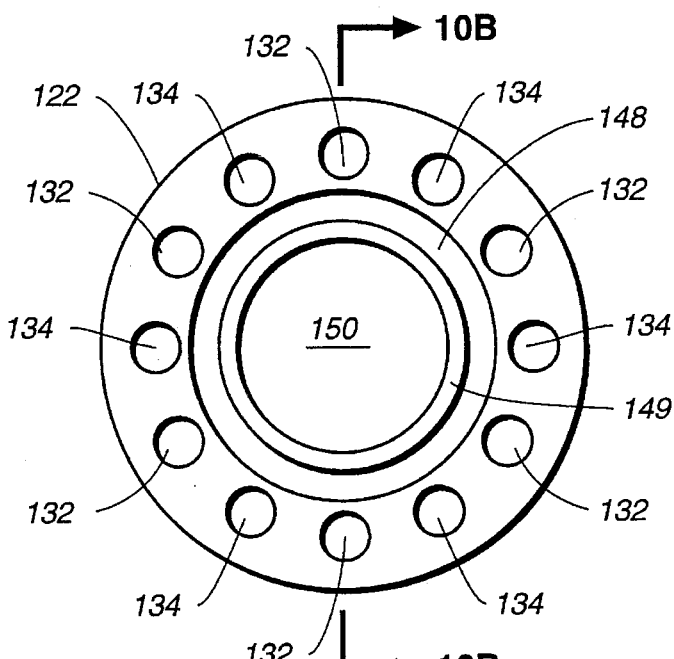
FIG._10A
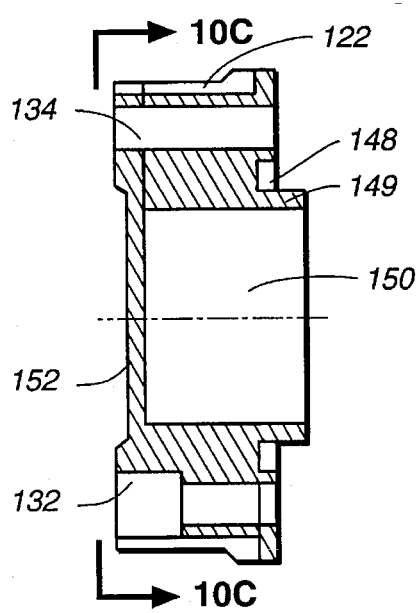
FIG._10B
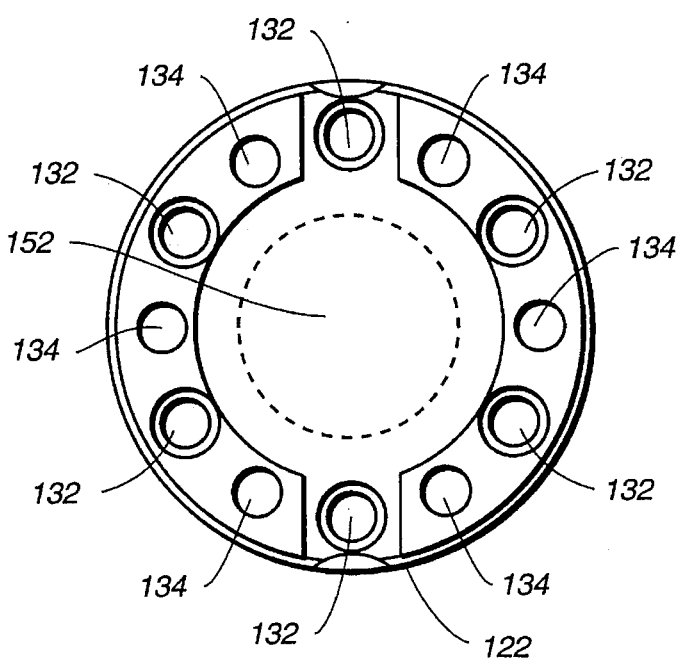
FIG._10C

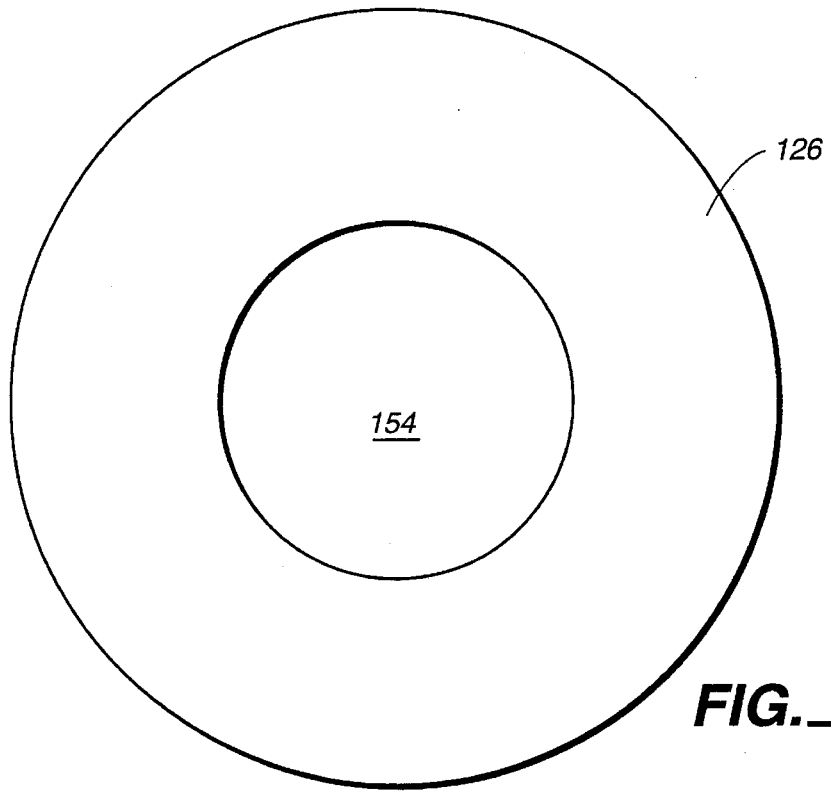
FIG._11
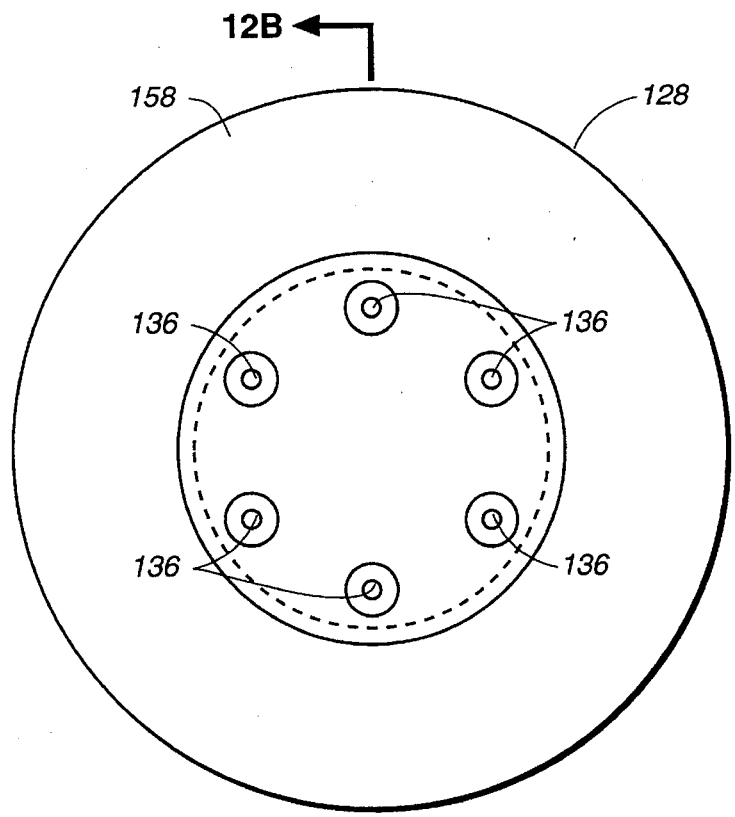
FIG._12A
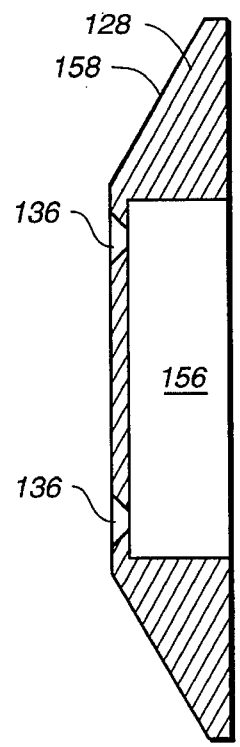
FIG._12B

ROTATING FLOATING MAGNETRON DARK-SPACE SHIELD AND CONE END

CROSS-REFERENCE TO RELATED APPLICATIONS

This application is a continuation-in-part of U.S. patent application Ser. No. 08/174,533 filed Dec. 30, 1993.

BACKGROUND OF THE INVENTION

The present invention relates generally to a magnetron sputtering apparatus, and more particularly to rotating magnetrons.

DC reactive sputtering is the deposition process most often used for large area commercial coating applications, such as the application of thermal control coatings to architectural and automobile glazing. In this process, the articles to be coated are passed through a series of in-line vacuum chambers isolated from one another by vacuum locks. This system may be referred to as a continuous in-line system or a glass coater.

Inside the vacuum chambers, a sputtering gas discharge is maintained at a partial vacuum at a pressure of about 3 millitorr. The sputtering gas comprises a mixture of an inert gas, such as argon, with a small proportion of a reactive gas, such as oxygen, for the formation of oxides.

Each chamber contains one or more cathodes held at a negative potential of about −200 to −1000 volts. A layer of material to be sputtered is applied to the cathode surface. This surface layer is known as the target or the target material. The reactive gas forms the appropriate compound with the target material.

Ions from the sputtering gas discharge are accelerated into the target and dislodge, or sputter off, atoms of the target material. These atoms, in turn, are deposited on a substrate, such as a glass sheet, passing beneath the target. The atoms react on the substrate with the reactive gas in the sputtering gas discharge to form a thin film. It is advantageous to produce the gas discharge in the presence of a magnetic field using an apparatus known as a magnetron. An array of magnets is mounted in a fixed position behind the target. The magnetic field causes electrons from the discharge to be trapped in the field and to travel in a spiral pattern, which creates a more intense ionization and higher sputtering rates. Appropriate water cooling is provided to prevent overheating of the target.

The architectural glass coating process was made commercially feasible by the development of the magnetically-enhanced planar magnetron. A disadvantage of the planar magnetron is that the target material is only sputtered in the narrow zone defined by the magnetic field. This creates a "racetrack"-shaped sputtering zone on the target. Thus, a "racetrack"-shaped erosion zone is produced as sputtering occurs. This causes a number of problems. For example, localized high temperature build-up eventually limits the power at which the cathodes can operate, and only about 25 percent of the target material is actually used before the target must be replaced.

The rotary or rotating magnetron was developed to overcome some of the problems inherent in the planar magnetron. The rotating magnetron uses a substantially cylindrical cathode and target. The cathode and target are rotated continually over a magnetic array which defines the sputtering zone. As such, a new portion of the target is continually presented to the sputtering zone which eases the cooling problem, allowing higher operating powers. The rotation of the target also ensures that the erosion zone comprises the entire circumference of the cathode covered by the sputtering zone. This increases target utilization. The rotating magnetron is described further in U.S. Pat. Nos. 4,356,073 and 4,422,916, the entire disclosures of which are hereby incorporated by reference.

The rotating magnetron requires bearings to permit rotation, and vacuum seals for the drive shaft, the electrical conduits and the cooling conduits. Vacuum and rotary water seals have been used to seal around the drive shaft and the conduits which extend between the coating chamber and the ambient environment. However, such seals have a tendency to develop leaks under conditions of high temperature and high mechanical loading. Various mounting, sealing and driving arrangements are described in U.S. Pat. Nos. 4,443,318; 4,445,997; and 4,466,877, the entire disclosures of which are also hereby incorporated by reference. These patents describe rotating magnetrons mounted horizontally in a coating chamber and supported at both ends. In this arrangement, two spindles, one of which is a drive shaft and the other an idler, are attached to the ends of the cathode.

It is often preferable, however, to support the magnetron at only one end designated as the drive end by a cantilever mount. The other end of the cathode may be referred to as the free end. The cantilever mounting arrangement produces the highest bearing loads. Several examples of cantilever mounted rotary magnetrons are given in *Design Advances and Applications of the Rotatable Magnetron*, Proceedings of the 32nd National Symposium of the American Vacuum Society, Vol. 4, No. 3, Part 1, pages 388–392 (1986), the entire text of which is hereby incorporated by reference. A cantilever mounted magnetron usually includes a bearing housing containing a drive shaft, a rotary vacuum seal, and at least two bearings spaced along the drive shaft, one of which may function as a shaft seal.

A rotating magnetron incorporating a cantilever mounted removable cathode and having low vacuum seal loads is described in U.S. Pat. Nos. 5,100,527 and 5,200,049, both assigned to the owner of the subject application, the entire disclosures of which are hereby incorporated by reference. Such a system allows, among other things, the cathode to be removed easily and without special equipment, thus reducing system down time both by reducing the time required to replace a cathode and by making simultaneous removal of two or more cathodes practical.

In general, a dark space shield or sleeve may be concentrically disposed about the cathode body and spaced from its surface to form a gap. The distance across this gap is less than the dark space length. The dark space is the region of gas discharge next to the cathode. Here, the electrons accelerate under an applied operating voltage to become adequately energized to cause ionization of the sputtering gas. The dark space length is a function of the type of sputtering gas, the gas pressure and the applied electric field. The dark space length, for example, may be on the order of three millimeters.

The dark space shield protects the cathode body from the gas discharge and resultant ion bombardment. Dark space shields are usually provided at both the drive end and the free end of the cathode. The shield around the drive end of the cathode body should prevent the sputtering gas discharge from contacting that end. The dark space shield is provided with a flange, for attachment to an appropriate mounting surface. For the dark space shields used heretofore at the supported end or ends of the cathode, the mounting surface has been the chamber wall or a flange attached to the chamber wall, such that the dark space shield does not rotate with the cathode. The shield is also electrically insulated from this mounting surface so that it is electrically isolated therefrom. Thus, it floats electrically and acquires an electrical potential of the gas discharge. A preferred material for the shield is stainless steel.

During sputtering, a film of deposited material grows on the dark space shield, usually under tensile or compressive stress. The stress is highest on sharp edges. Eventually the film deposited begins to spall off, beginning usually on such sharp edges and on areas where the film is thickest. If the resulting flakes of material fall onto a substrate, they obstruct deposition on the areas of the substrate that they cover, resulting in defective products. In order to minimize the rate of film growth on a given dark space shield surface, that surface should point in a direction as close as possible to the direction away from the sputtering target.

The spacing between the dark space shield and the cathode must be well controlled to be less than a dark space length and to ensure that the shield does not touch the cathode. In the rotating magnetron systems known heretofore, the imprecision in the positioning of the dark space shield around a supported end of the cathode can arise from four different sources. These sources are the imprecision in the positioning of the shield with respect to its mounting surface of the chamber wall, the imprecision in the positioning of the bearing housing relative to the chamber wall, the imprecision in the positioning of the spindle relative to the bearing housing, and the imprecision in the positioning of the cathode relative to the spindle.

Since it is difficult to ground shields at the free end of cantilever cathodes, these shields may be floating. Such shields are disclosed in above-mentioned U.S. Pat. No. 5,100,527. These shields have a sleeve spaced less than one dark space length from the cathode, and, as described above, become covered in time with a film of sputtered material which eventually begins to spall off.

Accordingly, an object of the present invention is to provide a dark space shield for a supported end of a rotatable cathode wherein the imprecision in the shield to cathode spacing is reduced.

Another object of the present invention is to provide a dark space shield wherein the tendency of the growing film to spall off the shield is reduced.

Yet another object of the present invention is to provide a cone end at the free end of a rotatable cantilever mounted cathode wherein the growth of a film onto the cone end is impeded.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to a magnetron cathode comprising a rotatable cathode having one supported end capable of being attached to a spindle and a free end. A shield is attached to the cathode to rotate therewith at the free end. The shield faces away from a gas discharge and does not overlap a cylindrical wall of the cathode. The shield is attached to the cathode without electrical conduction between the shield and the cathode.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 1 is a partial cross-sectional and elevational view of a sputtering chamber utilizing a supported end dark space shield according to the present invention on the drive end of a cantilever mounted cathode.

FIG. 2 is a partial cross-sectional exploded and enlarged view of the dark space shield assembly of FIG. 1.

FIG. 3 is a cross-sectional view of a cantilever-mounted cathode, its drive end dark space shield, drive shaft and bearing housing according to the present invention. Only the upper half of the drive end of the cathode, drive shaft and bearing housing is shown. The lower half is symmetrical with the upper half.

FIG. 4A is a view of the dark space shield of the present invention along line 4A—4A of FIG. 2.

FIG. 4B is a cross sectional view of the dark space shield along line 4B—4B of FIG. 4A.

FIG. 5A is an enlarged view, along the longitudinal axis of the cathode, of the pin retainer shown in FIG. 2.

FIG. 5B is an elevational view of the pin retainer along line 5B—5B of FIG. 5A.

FIG. 6A is an enlarged view of the lock pin shown in FIG. 2.

FIG. 6B is an end view of the lock pin along line 6B—6B of FIG. 6A.

FIG. 7A is an enlarged view of the socket shown in FIG. 2.

FIG. 7B is an end view of the socket along line 7B—7B of FIG. 7A.

FIG. 8A is an enlarged, cross-sectional view of the free end of the cathode of FIG. 1.

FIG. 8B is an exploded view of the free end of FIG. 8A illustrating the cone end.

FIG. 9 is an end view of the bearing along line 9—9 of FIG. 8B.

FIG. 10A is an end view of the insulating mount along lines 10A—10A of FIG. 8B.

FIG. 10B is a cross-sectional view of the insulating mount of FIG. 10A along line 10B—10B of FIG. 10A.

FIG. 10C is an end view of the insulating mount along lines 10C—10C of FIG. 10B from the side opposite the cathode.

FIG. 11 is an end view of the insulating washer along line 11—11 of FIG. 8B.

FIG. 12A is an end view of the floating cone end along line 12A—12A of FIG. 8B.

FIG. 12B is a cross-sectional view of the floating cone end of FIG. 12A along the line 12B—12B of FIG. 12A.

DESCRIPTION OF THE PREFERRED EMBODIMENT

The present invention will be described in terms of the preferred embodiment. The preferred embodiment is a rotatable magnetron cathode with a dark space shield attached at a supported end of the cathode. The cathode is cantilever mounted, and the dark space shield is attached at the cathode's drive end to rotate therewith. As shown in FIG. 1, the rotatable magnetron apparatus 42 may comprise a cantilever-mounted tubular cathode 52 in a sputtering or coating chamber 41. The coating chamber may be bounded by walls 44 and sealed by a cover 32 that abuts against a flange 43.

A substrate 36 to be coated may be transported through coating chamber 41 on rollers 38 mounted on a spindle 40. The spindle may be supported on bearings 37 attached to a floor 33 of the sputtering chamber.

Cathode 52 has a flange 50 attached to a flange 48 of a drive shaft 68 (see also FIGS. 2 and 3) used to rotate the cathode. The cathode can be removed while leaving the drive shaft in place by disconnecting flange 50 from flange 48.

Flanges 48 and 50 are surrounded by stationary water ring 46 which is water cooled and electrically grounded. The free end 31 of cathode 52 includes a dark space shield 30. The present invention provides for a rotating dark space shield 54 at the drive end of the cathode, which is attached to and rotates with the cathode. Dark space shield 54 may be attached to cathode flange 50 using, for example, three lock pin and socket assemblies 56 positioned 120° apart from each other. Stand-off insulators 58 maintain a minimum spacing between shield 54 and cathode flange 50 and may be positioned diametrically opposite lock pin and socket assemblies 56.

FIG. 2 is an exploded view of the arrangement used to attach dark space shield 54 to cathode flange 50. Sockets 64 and o-rings 66 are inserted into a recess 63 of cathode flange 50 before mounting the cathode to drive shaft flange 48, by, for example, bolting it to the drive shaft flange. O-rings 66 resist deformation of sockets 64 thus improving lock pin retention. Lock pins 60 are secured to shield 54 using retainers 62 (see FIGS. 5A and 5B). After stand-off electrical insulators 58 are inserted into recesses 59 and 84 in cathode flange 50 and dark space shield 54, respectively, the shield is attached to flange 50 by inserting pins 60 into sockets 64.

FIG. 3 is a more detailed cross-sectional view of the arrangement used to rotate, cool and shield the cathode. Only the upper half of the drive end of the cathode, drive shaft and bearing housing is shown. The lower half is symmetrical with the upper half. The entire cathode, drive shaft and bearing housing assemblies are supported by flange 49 welded to chamber wall 44. Bearing housing 51 is mounted on the exterior side of flange 49 relative to coating chamber 41. Water ring 46 with cooling channel 47 is mounted on the interior side of flange 49 relative to coating chamber 41. Water ring 46 is covered by a cleanable aluminum cover 45. A hollow drive shaft 68 is held within bearing housing 51 by bearing 34 and is sealed against the bearing housing by a rotary seal 83. Preferably, seal 83 is a ferrofluidic seal. As is known, a ferrofluidic seal incorporates a colloidal suspension of ultramicroscopic magnetic particles in a carrier liquid. Drive shaft 68 is rotated relative to bearing housing 51 by a motor (not shown). Drive shaft flange 48 is secured to drive shaft 68 by nut 82. Concentric with and inside drive shaft 68 is cooling fluid transport tube 70 which, together with the drive shaft, defines inner and outer cooling fluid conduits 71 and 69, respectively. Fluid transport tube 70 does not rotate with drive shaft 68 but is held concentric with drive shaft 68 by centering ring 77.

The demountable cathode 52 and dark space shield 54, whose combination is bolted to drive shaft flange 48 as described above, are next described with reference to FIG. 3. Cylindrical cathode 52 is covered over most of its length by a target material 78. At the ends of the cylindrical sputtering zone, the cathode is preferably covered with a collar 80 of a material such as titanium to reduce arcing and increase maximum power as described in co-pending U.S. patent application Ser. No. 08/158,729, (now U.S. Pat. No. 5,470,452), assigned to the owner of the subject application, the entire disclosure of which is hereby incorporated by reference. The collars may also extend target life by reducing erosion at the plasma "racetrack"-turnarounds where the power density is greatest.

Cathode 52 has, at its drive end, cathode mounting flange 50 for attachment to drive shaft flange 48. The tubular body of the cathode is attached to flange 50 by welding or bolting. A check valve 76 for stopping the flow of coolant when the cathode is removed is mounted on a flange 74. Rotatably supported inside a bushing 79 and concentric with cathode 52 is fluid transport tube 72, which, together with cathode 52, defines inner and outer cooling fluid conduits 73 and 75, respectively. When the cathode is mounted on the drive shaft, check valve mounting flange 74 seals against drive shaft 68 and cooling fluid transport tube 70 seals against fluid transport tube 72. As a result, cathode conduits 73 and 75 communicate with the corresponding conduits 71 and 69 inside the drive shaft. Dark space shield 54 is attached to cathode mounting flange 50 as discussed above, using lock pin and socket assemblies 56.

As shown in FIGS. 4A–4B dark space shield 54 has an opening 89 whose diameter is sufficient to accommodate the tubular portion of cathode 52 with a clearance equal to the dark space length. The shield has a base 85 facing cathode flange 50 at the drive end of the cathode when mounted. In order to reduce the tendency of deposited material to spall off the shield, it is advantageous for the shield to have a section 87 of generally-triangular cross-section near its base, and rounded edges 91. That part 93 of the dark space shield extending away from the base toward the free end of the cathode may be generally cylindrical. Three recesses 84 are provided in the base 85 of the shield for stand-off insulators 58, shown in FIG. 2. Three rectangular recesses 86 are also provided in the base for pin retainers 62. Three recesses 90 are provided, inside recesses 86, for bases 96 of lock pins 60 (see FIGS. 2B and 6A). Also inside each recess 86, on either side of recess 90, are provided two threaded holes 88. These holes and two matching tapered holes 94 in pin retainer 62 (see FIGS. 5A–5B) are used for bolting the pin retainers into recesses 86. Each lock pin 60 passes through hole 92 of its retainer and is held with its base 96 captive between dark space shield 54 and a retainer 62, in a recess 90 of the shield.

As shown in FIGS. 6A and 6B, lock pins 60 have a body member 98 with a tapered end 100 to facilitate insertion into a socket 64.

Each lock pin 60 also has a neck 102 which, when the dark space shield is mounted, is engaged by a matching bore 110 of socket 64, as shown in detail in FIGS. 7A and 7B. Sockets 64 also have a base 104 for retention inside recesses 63 of cathode mounting flange 50, and a groove 108 for an o-ring 66 for improved pin retention. Two perpendicular longitudinal radial saw cuts 112 provide the required increased flexibility for lock pin insertion and extraction. The socket may be made of nylon, which is an electrical insulator, whereby the dark space shield is electrically floating relative to the cathode.

FIG. 8A is a cross-sectional view of the free end 31 of cathode 52. As shown, the end of transport tube 72 is closed by a plug 114 using a shrink fit. Before assembly, tube 72 is heated and plug 114 is cooled. Plug 114 is inserted into the end of tube 72 and it is tightly held after they reach the same temperature. A hole or passageway 116 is provided in tube 72 to allow the cooling fluid to exit from conduit 73 into conduit 75.

At the end of cathode 52 is a flange 118 hermetically sealed to the cathode wall but with an opening 119 through which tube 72 and plug 114 pass with some clearance. Opening 119 is sealed by an insulating mount 122 which has an o-ring groove 148 for sealing against flange 118. Plug 114 is held inside insulating mount 122 by bearing 120. Insulating mount 122 is mounted onto flange 118 by means of bolts (not shown) extending through threaded holes 130 of flange 118 and countersunk holes 132 of insulating mount 122. A metallic cone end shield 128 is mounted onto insulating mount 122 using bolts extending through threaded holes 134 of the insulating mount and holes 136 of the cone end. Cone end 128 is thus insulated from flange 118. Between flange 118 and cone end 128 is an insulating rubber washer 126. FIG. 8B shows their assembly comprising cone end 128, washer 126, insulating mount 122 and bearing 120.

FIG. 9 is an end view of bearing 120, which is also shown in cross section in FIG. 8B. Bearing 120 is preferably made of a low coefficient of friction ultra high molecular weight polyethylene (UHMW) and is cylindrical with a cavity 121 for receiving plug 114. Cavity 121 communicates with the outside at an open end 146 and is bounded by side wall 142 and end wall 140. Wall 140 is at a closed end 144 of the bearing. Wall 140 has a threaded orifice 138 for facilitating removal of the bearing by insertion of a screw.

Bearing 120 fits inside insulating mount 122, shown in more detail in FIGS. 10A–10C. As shown in FIG. 10A, insulating mount 122 is generally cylindrical, with a cavity 150 for receiving bearing 120 and with two alternating sets of six holes 132 and 134, respectively, close to the periphery. Holes 132 are countersunk and used to bolt insulating mount 122 onto cathode end flange 118. Holes 134 are threaded and are used to bolt cone end 128 onto insulating mount 122. Around the opening of cavity 150 is a lip 149 which is inserted into flange 118. Around lip 149 is an o-ring groove 148 used to make a hermetic seal to flange 118. An end wall 152 at the end of insulating mount 122 seals the inside of the cathode.

Around insulating mount 122 and between cone end 128 and flange 118 is a rubber washer 126 with hole 154, shown in FIGS. 8B and 11. Washer 126 and insulating mount 122 insulate the cone end from the cathode such that the cone end is floating electrically.

Cone end 128 is shaped generally as a truncated cone, as shown in FIGS. 12A and 12B. A cavity 156 in the cone end receives insulating mount 122. The periphery 158 of cone end 128 is tapered. This shape minimizes the build-up and flaking of sputtered material. A set of countersunk holes 136 are used to bolt cone end 128 onto insulating mount 122. The insulating mount, in turn, as discussed, is bolted to flange 118. By having the end of the cathode floating rather than at cathode potential, arcing from the cathode end is eliminated. Unlike prior art shields, cone end 128 does not have a sleeve overlapping the cylindrical wall of the cathode.

In summary, a rotatable magnetron cathode with a dark space shield attached at a supported end of the cathode and rotatable therewith has been described. Such an arrangement allows improved control of the gap between the cathode and the dark space shield. The shape of the shield also retards spalling off of the deposited material built-up on the shield. As noted, such a shield can be used for a cantilever mounted cathode at the drive end of the cathode. The shield can also be used for either end, or both, of a cathode supported at both ends. The cathode can be mounted horizontally, vertically, or at any other angle.

A cone end for shielding the free end of cantilever mounted cathodes has also been described. The cone end is electrically floating and, not having a sleeve overlapping the cylindrical cathode surface, faces away from the gas discharge to impede the growth of a sputtered film on the cone end surface.

The present invention has been described in terms of a preferred embodiment. The invention, however, is not limited to the embodiment depicted and described. Rather, the scope of the invention is defined by the appended claims.

What is claimed is:

1. A magnetron cathode, comprising:

a rotatable magnetron cathode having one supported end capable of being attached to a spindle and a free end;

a shield attached to said magnetron cathode to rotate therewith at said free end, said shield facing away from a gas discharge and not overlapping a cylindrical wall of said magnetron cathode; and means for attaching said shield to said cathode without electrical conduction between said shield and said cathode.

2. The magnetron cathode of claim 1 wherein said attaching means includes:

a flange affixed to said cathode at said free end;

an insulating mount affixed to said flange and including a first cavity, said shield mounted to said insulating mount;

a cylindrical bearing coaxially disposed in said first cavity and said bearing including a second cavity for receiving a member projecting from said cathode; and an insulating washer disposed between said shield and said flange about said insulating mount.

3. The magnetron cathode of claim 2 wherein said cylindrical bearing is made of an ultra high molecular weight polyethylene and said member includes an end of a transport tube.

4. The magnetron cathode of claim 2 wherein said insulating mount is generally cylindrical in shape and includes a lip around said first cavity which is inserted into an opening in said flange and an O-ring groove around said lip for making a hermetic seal to said flange.

5. The magnetron cathode of claim 2 wherein said cylindrical bearing has an end wall including a threaded orifice for facilitating removal of said bearing.

6. The magnetron cathode of claim 2 wherein said shield includes a cavity for receiving said insulating mounting for mounting said shield to said insulating mount.

7. The magnetron cathode of claim 2 wherein said member includes a transport tube and a plug.

8. The magnetron cathode of claim 1 wherein said shield has a truncated cone shape and a tapered peripheral outer surface.

* * * * *